(12) United States Patent
Liao et al.

(10) Patent No.: US 6,903,386 B2
(45) Date of Patent: Jun. 7, 2005

(54) TRANSISTOR WITH MEANS FOR PROVIDING A NON-SILICON-BASED EMITTER

(75) Inventors: Hung Liao, Corvallis, OR (US); Bao-Sung Bruce Yeh, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/172,213

(22) Filed: Jun. 14, 2002

(65) Prior Publication Data

US 2003/0230762 A1 Dec. 18, 2003

(51) Int. Cl.⁷ .......................................... H01L 31/0328
(52) U.S. Cl. ..................... 257/197; 257/190; 257/205; 257/511; 257/517; 257/557

(58) Field of Search ................................ 257/197, 190, 257/198, 205, 511, 517, 194, 526, 557, 558, 183, 15, 20, 24, 192, 195, 280, 281, 47, 208

(56) References Cited

U.S. PATENT DOCUMENTS

| 4,329,625 A | * | 5/1982 | Nishizawa et al. | 315/158 |
| 4,617,724 A | * | 10/1986 | Yokoyama et al. | 438/315 |
| 5,488,236 A | * | 1/1996 | Baliga et al. | 257/132 |
| 6,423,990 B1 | * | 7/2002 | El-Sharawy et al. | 257/197 |

* cited by examiner

Primary Examiner—Minhloan Tran
Assistant Examiner—Tan Tran

(57) ABSTRACT

A transistor includes a means for providing a non-silicon-based emitter with a flexible structure to relieve lattice mis-match between the emitter and the base.

9 Claims, 5 Drawing Sheets

TRANSISTOR WITH MEANS FOR PROVIDING A NON-SILICON-BASED EMITTER

CROSS REFERENCE TO RELATED APPLICATIONS

Not Applicable

STATEMENT REGARDING FEDERALLY SPONSORED RESEARCH OR DEVELOPMENT

Not Applicable

INCORPORATION BY REFERENCE OF MATERIAL SUBMITTED ON A COMPACT DISC

Not Applicable

BACKGROUND

Many electronic devices, such as telecom devices, incorporate semiconductors in their design and operation. Semiconductors can be differentiated from metals and insulators. The behavior of valence, or unbonded electrons in a given material helps to determine whether that material acts as a metal, an insulator, or a semiconductor. Electrons in a material occupy different quantum, or energy states, depending on factors such as temperature and the absence or presence of an externally applied electrical potential. The highest energy quantum state occupied by an electron for a given material, while that material is at 0°K is known as the Fermi energy, $E_F$.

In metals, the Fermi energy, $E_F$ falls in the middle of a band of allowed quantum states, closely spaced in energy. As a result, this means that an infinitesimally small voltage allows an electron to be promoted from lower energy quantum states to higher energy quantum states. Therefore, electrons may move freely through metals. The ability to easily permit the movement of electrons in a material allows metals to carry an electrical current. As such, metals are excellent conductors.

For insulators, the Fermi energy, $E_F$ falls inbetween widely spaced quantum energy states. As a result, when compared to metals, a comparatively large voltage is required to promote an electron to a more energetic level. Electrons in insulators are much less mobile and can carry far less current than metals in response to a given voltage.

Semiconductors are similar to insulators in that the Fermi energy, $E_F$ falls inbetween spaced quantum energy states. However, the gap between these energy states in a semiconductor is more narrow than the gap for an insulator. This allows electrons in semiconductors to be promoted by external energy from quantum states in the lower-energy valence bands to quantum states in the higher-energy valence bands. The ability of electrons in semiconductors to be promoted from one quantum state to another provides the electron mobility needed for current flow.

Promotion of an electron produces a negatively charged mobile conduction band electron, or free electron, as well as a positively charged hole in the valence band. Both the free electron and the hole are mobile charge carriers that support the flow of current. The density of positive or negative charge carriers in a semiconductor can be increased by adding ionized impurities, or dopants, to a semiconductor. A semiconductor material with no added impurities is referred-to as an intrinsic semiconductor. A semiconductor material with added dopants is referred-to as an extrinsic semiconductor. An extrinsic semiconductor with an increased density of positive charge carriers, or holes, is referred-to as a p-type semiconductor. An extrinsic semiconductor with an increased density of negative charge carriers, or free electrons, is referred-to as an n-type semiconductor.

Transistors and other semiconductor devices are based on junctions between different semiconductor materials of different properties. In heterojunctions, regions of different bulk semiconductor materials are joined at an interface. For example, n-type semiconductors may be interfaced with p-type semiconductors. In homojunctions, regions of the same bulk semiconductor (all n-type, or all p-type), each with possibly different levels or types of dopants to produce different semiconductor parameters, are joined at an interface.

At the interface, or junction between two semiconductor materials, a depletion region forms due to the movement of free electrons from the n-type region into the adjoining p-type region, where the free electrons combine with the holes. This effectively collapses the free electrons and electron holes into bound valence electrons. These bound valence electrons in the depletion region result in a potential energy barrier against the migration of additional free electrons from the n-type material into the p-type material.

A forward bias may be applied to the semiconductor materials by connecting a positive end of a voltage to the p-type material and the negative end of the voltage to the n-type material. As the forward bias is increased, the depletion region narrows and eventually does not exist. At this point, as the voltage is further increased, current will begin to flow between the semiconductor materials. When the forward bias is removed, or reduced to the point where the depletion region exists again, current will not flow between the semiconductor materials.

Semiconductors are often incorporated in the construction of microcircuit devices. A given microcircuit may have bipolar transistors, metal-oxide semiconductor (MOS) transistors, diodes, resistors, or any combination thereof Bipolar transistors have at least three semiconductor regions: A base of a first type of semiconductor material, and a collector and an emitter of a second type of semiconductor material. Microcircuits which incorporate bipolar transistors are often fabricated using silicon (Si) based materials and processes. Maximizing Si-based bipolar transistor performance is a goal of the Si integrated circuit industry. In furtherance of this goal, the vertical dimensions of bipolar transistors are being scaled back. The scaling-back may result in certain device operational limits. For example, when the base thickness is decreased, the doping level must be increased in order to control the depletion region and maintain a low base resistance. Unfortunately, increasing the doping level of the base decreases the gain (and therefore the utility) of the bipolar transistor.

BRIEF SUMMARY

Not Applicable

DETAILED DESCRIPTION OF THE PREFERRED EMBODIMENTS

Figure 1:
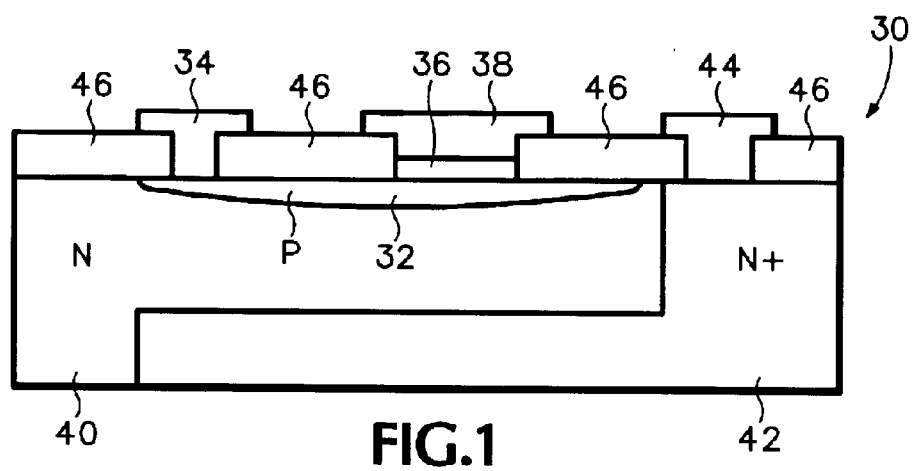
FIG. 1 schematically illustrates one embodiment of a group III/VI semiconductor heterojunction bipolar transistor (HBT).

FIG. 1 schematically illustrates one embodiment of a layered group III/VI semiconductor heterojunction bipolar transistor (HBT). FIG. 1 is not drawn to scale. The group III/VI semiconductor designation refers to semiconductors made from combinations of elements from group III on the periodic table and group VI on the periodic table. Examples of suitable combinations for group III/VI semiconductors include GaS, GaSe, GaTe, InS, InSe, InTe, and TlS. For the sake of simplicity, InSe will be used in the embodiment descriptions of layered group III/VI semiconductor HBT's.

The heterojunction bipolar transistor (HBT) 30, shown in the embodiment of FIG. 1, has a base 32 constructed of a p-type material coupled to a base contact 34, and coupled to an emitter 36 constructed of a layer of group III/VI semiconductor, here shown as InSe. The InSe emitter 36 is an intrinsic n-type semiconductor, and may be used in this capacity, or the InSe emitter 36 may be doped with n-type impurities to result in an n-type material with more free electrons than a substantially pure InSe emitter 36. The InSe emitter 36 is also coupled to an emitter contact 38.

An n-type semiconductor layer 40 is coupled to the base 32. A buried collector 42, constructed from an enhanced n-type semiconductor layer, or an N$^+$ type semiconductor, is coupled to a collector contact 44 and the n-type semiconductor layer 40. Although it is preferable to have a buried collector 42, an HBT may be constructed without a buried collector 42. In this case, the n-type semiconductor layer 40 acts as a collector and would be coupled to the base 32 and the collector contact 44. As illustrated in FIG. 1, this embodiment of a heterojunction bipolar transistor (HBT) 30 is an n-type device, because the emitter is an n-type semiconductor, the base is a p-type semiconductor, and the collector is an n-type semiconductor.

It is also possible to make a group III/VI emitter HBT 30 as a p-type device. To do this, the InSe emitter 36 must be doped with p-type impurities until it behaves as a p-type material. The base 32 would be constructed of an n-type material. The n-type semiconductor layer 40 would be replaced with a p-type semiconductor layer, and the buried collector 42 would be a replaced with an enhanced P$^+$ type material. Although a p-type version of a group III/VI emitter HBT 30 is possible, an n-type version will be used throughout the specification for the sake of explanation. This specification is intended, however, to cover both n-type and p-type devices.

The base 32, the n-type semiconductor layer 40, and the buried conductor 42 are preferably constructed of silicon (Si) based materials which have been doped with n-type or p-type impurities as described above. The InSe emitter 36 may be epitaxially grown on the Si-based base 32. Since InSe can have a wide energy band gap (1.4 electron volts (eV) to 1.9 eV or greater) between allowable quantum energy states for valence electrons, as compared to the energy band gaps of 0.8 eV to 1.1 eV for prior Si-based emitters, the InSe emitter 36 and the base 32 may be made thinner while still maintaining a small depletion region between the base 32 and the emitter 36 and without reducing the bipolar gain. An epitaxially grown InSe emitter 36 also has the advantage of relatively low-temperature requirements, low bulk and contact resistances, and good stability during later interconnect process steps when compared to other high band-gap materials such as GaP, semi-insulating poly-silicon films, oxygen-doped Si epitaxial films, —SiC, as well as phosphate doped hydrogenated microcrystalline Si.

Table 1 shows simulation values for one embodiment of an HBT 30 having an InSe emitter 36.

TABLE 1

| | Material | Thickness | Carrier Type | Carrier Concentration (carriers/cm$^3$) |
|---|---|---|---|---|
| Emitter | InSe | 0.1 um | N | 1 × 10$^{17}$ |
| Base | Si | 0.05 um | P | 1 × 10$^{18}$ |
| Collector | Si | 0.95 um | N | 1 × 10$^{15}$ |

Figure 2:
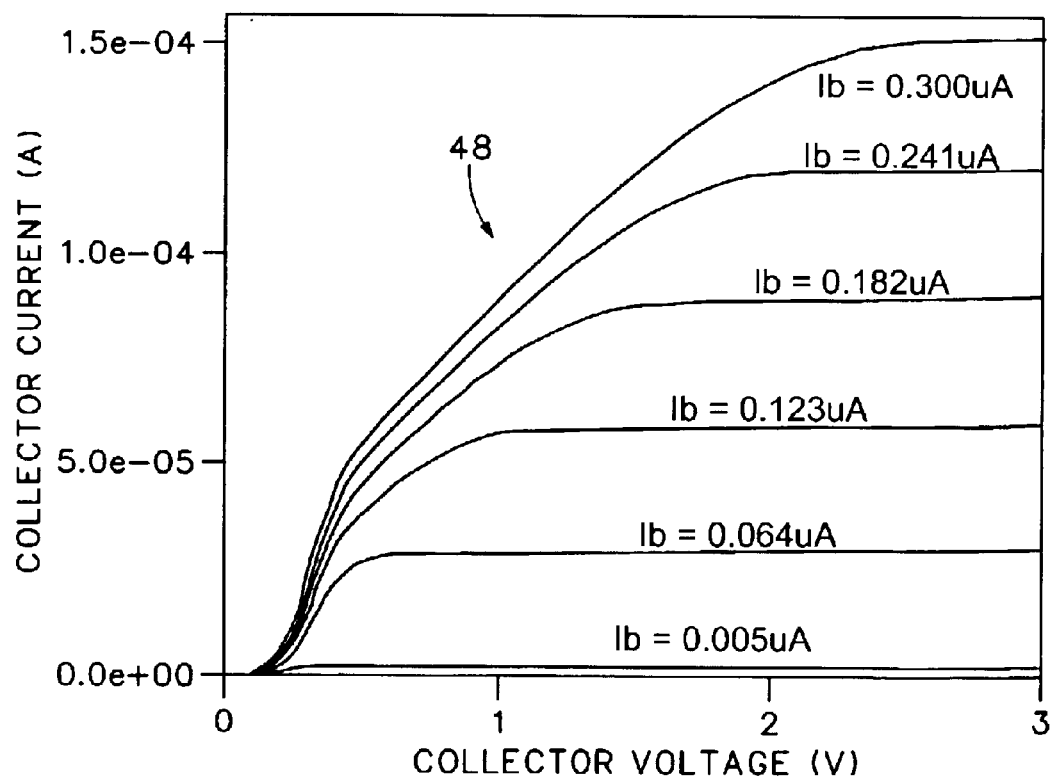
FIGS. 2–4 illustrate sample performance of one embodiment of a group III/VI semiconductor HBT.
Figure 3:
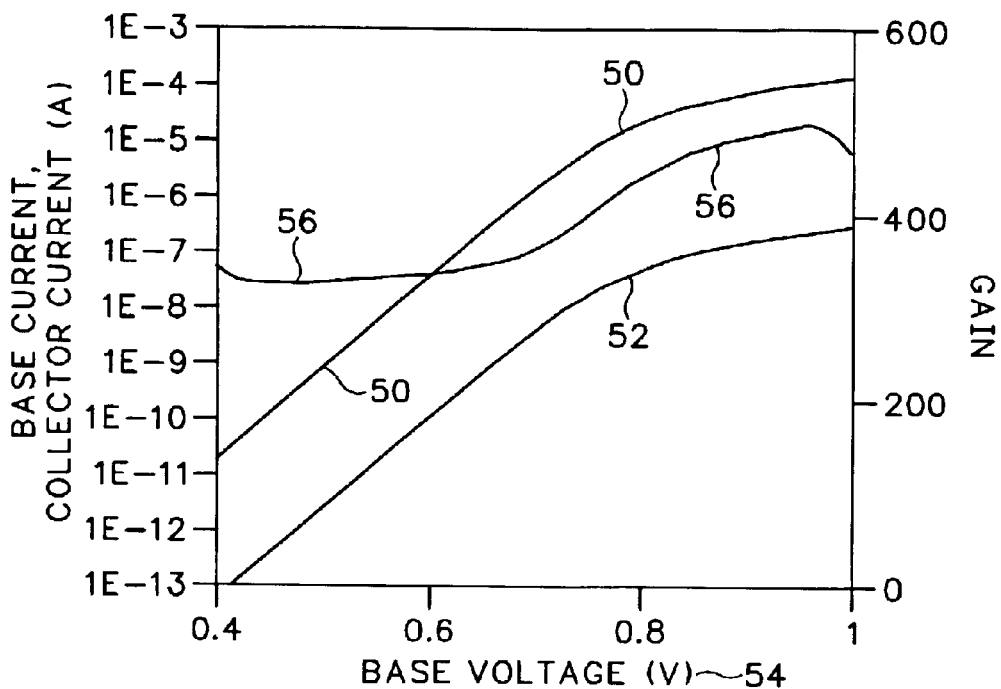
Figure 4:
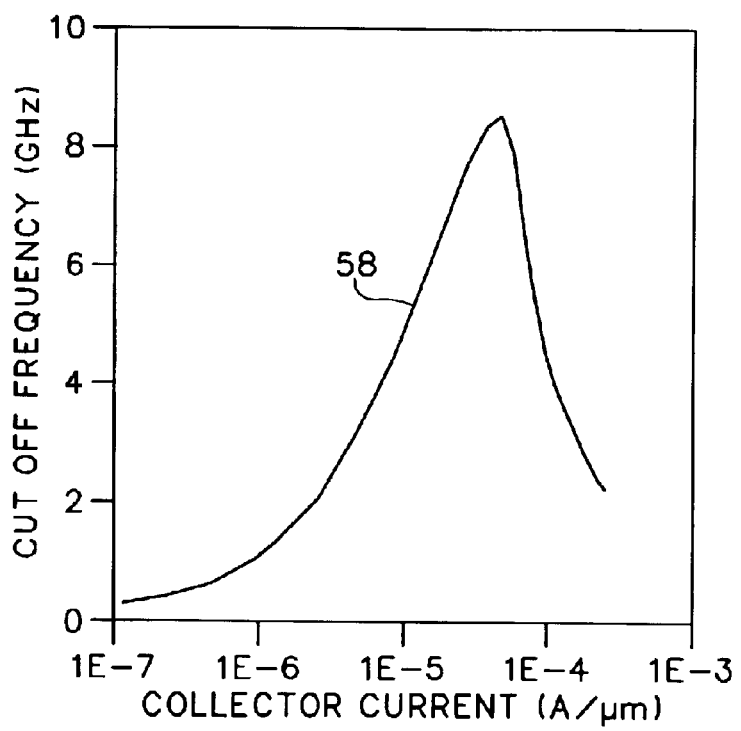

FIG. 2 illustrates several collector current ($I_C$)-collector voltage ($V_C$) curves 48 for the HBT 30 embodied in table 1. FIG. 3 illustrates collector current 50 ($I_C$) and base current 52 ($I_B$) as a function of base voltage 54 ($V_B$) for the values embodied in table 1. A gain 56 is also plotted to show the relative current gain from $I_B$ 52 to $I_C$ 50 at a given $V_B$ 54. FIG. 4 illustrates a cutoff frequency curve 58 plotted as a function of $I_C$. FIGS. 2–4 show that the HBT 30, as specified by the parameters in table 1, has a reasonable gain and frequency response. HBT 30 performance can be altered to meet a particular gain and frequency response criteria by altering the thickness of the base, changing the doping level of the base, and/or changing the doping level of the emitter. Such alterations are well-within the abilities of those skilled in the art, and the values illustrated in table 1 are not intended to be limiting in any way.

At an atomic lattice level, The InSe emitter 36 is a layered semiconductor compound. The layers interact with each other through Vanderwaal forces, while within the layer, atoms are bound by valence forces. The Vanderwaal forces are less than the valence forces, allowing flex between layers. This flexibility of the InSe emitter 36 acts as a buffer between the mismatched lattice structure of the Si base 32 and the emitter 36. Other non-silicon, and non-group III/VI emitters have lattice structures which are difficult to grow on a silicon substrate, but the flexibility of the layered group III/VI emitter 36 is less susceptible to manufacturing issues. Multiple HBT's 30 may be formed on a single integrated circuit, microchip, or microcircuit, and the InSe emitter 36 can be successfully manufactured through epitaxial growth at a temperature below 500° C. This relatively low thermal budget should make the group III/VI high band-gap emitter HBT 30 attractive to the integrated circuit industry, since such HBT's 30, with advantages previously noted, can be formed in concert with MOS (metal oxide semiconductor) processes. Micro-circuits with both bipolar transistors and MOS transistors are known as BiMOS devices. BiMOS devices are especially useful in applications which need the Bipolar transistors for analog signal conditioning and the MOS transistors for digital signal conditioning and processing.

Figure 5A:
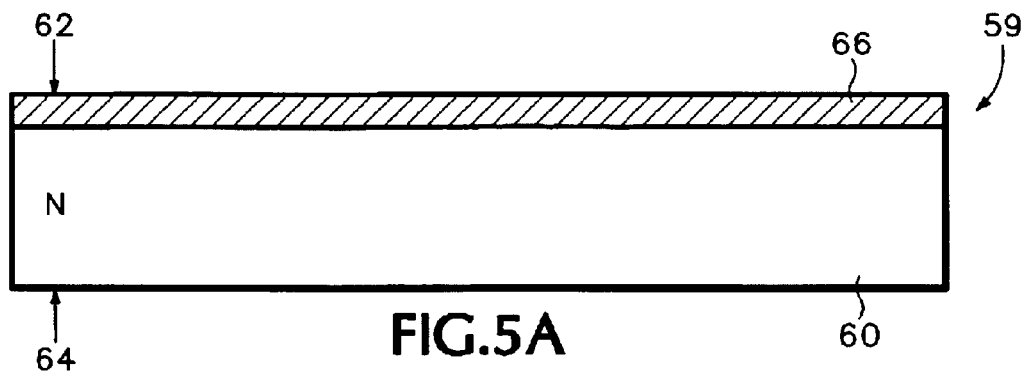
FIGS. 5A–5D illustrate embodiments of buried layer formation and isolation in an embodiment of a microcircuit device.
Figure 5B:
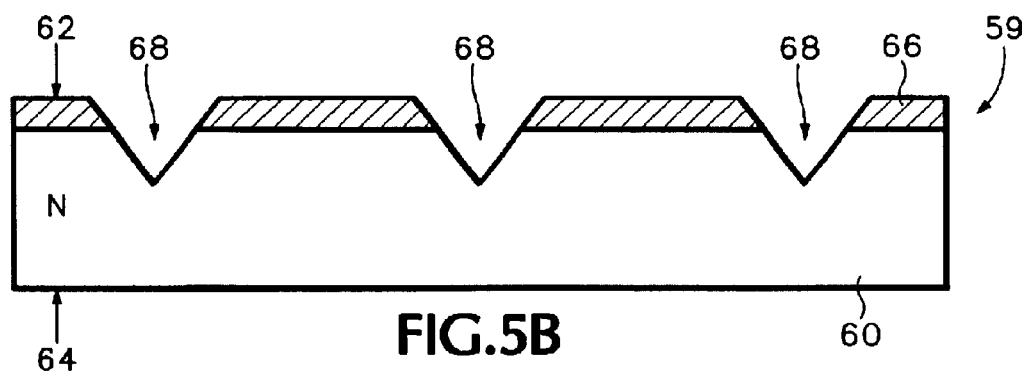
Figure 5C:
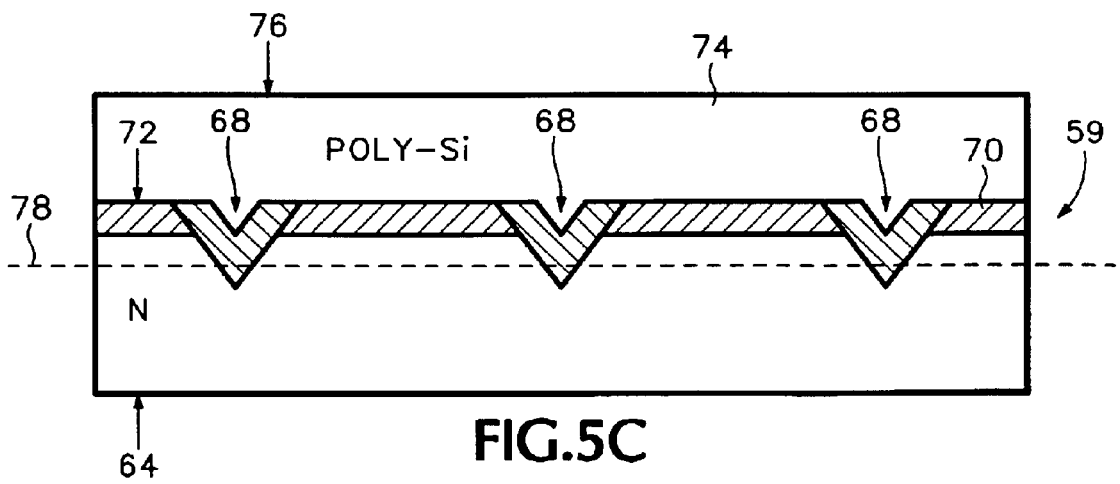
Figure 5D:
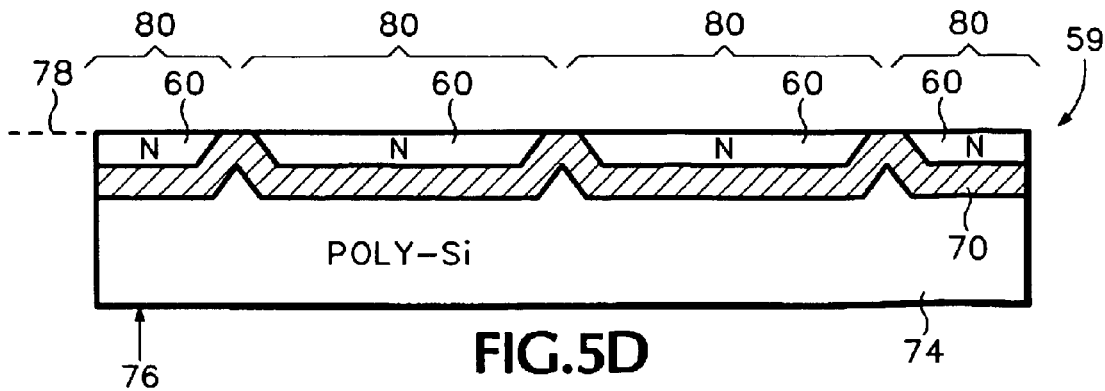
Figure 6:
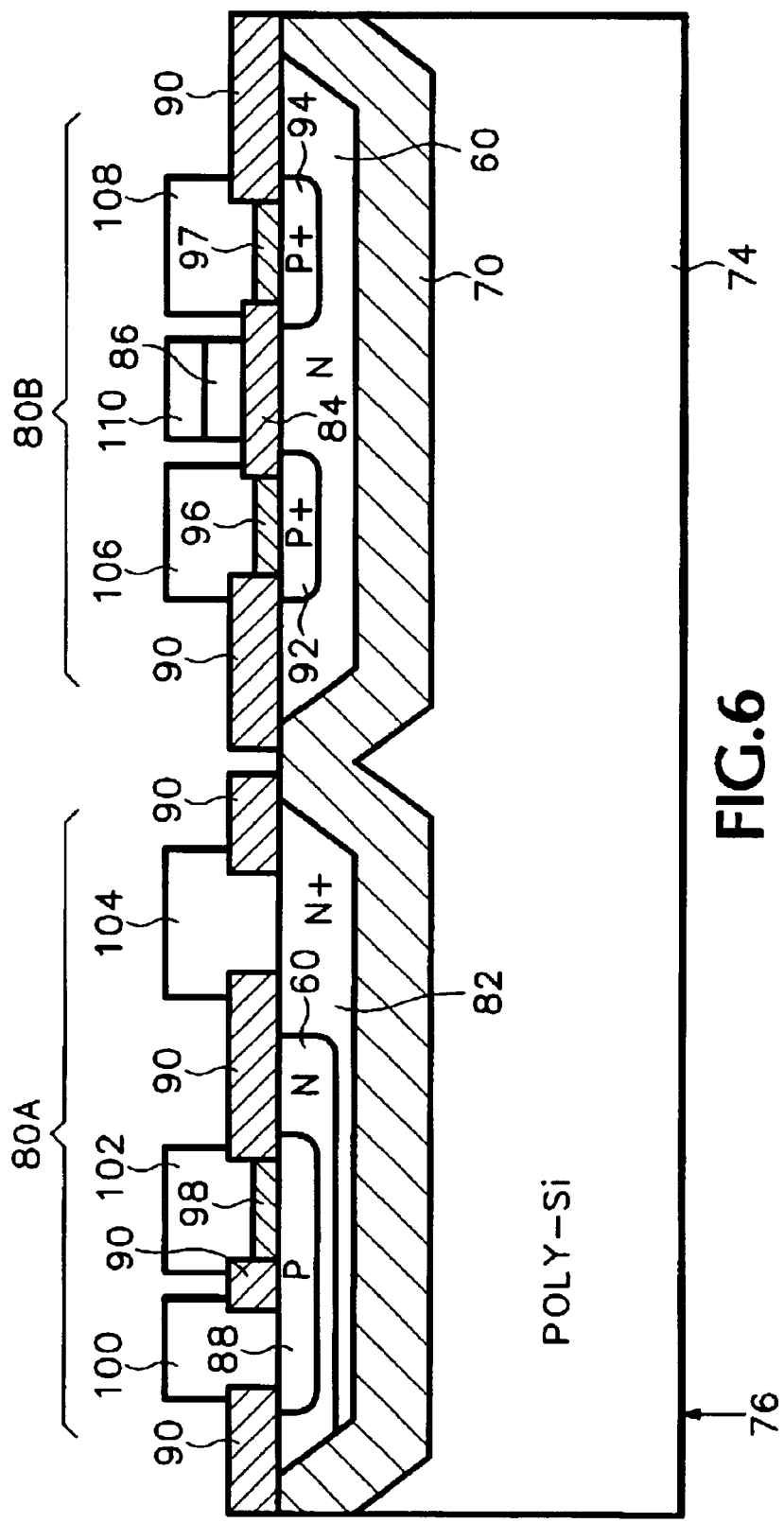
FIG. 6 illustrates embodiments of a group III/VI semiconductor HBT and a metal oxide semiconductor (MOS) transistor formed on the same embodiment of a microcircuit device.

FIGS. 5A–6 illustrate an embodiment of the construction of a BiMOS device, or microcircuit 59, having at least one group III/VI emitter HBT 30. For simplicity of illustration, InSe will be used as an example of a group III/VI emitter, but other group III/VI combinations are possible, as previously discussed.

The starting point in this embodiment of a microcircuit 59 is the buried layer formation. FIG. 5A illustrates in side cross-section a slice of semiconductor grade Si which has either been diffused with n-type impurities, epitaxially grown from a seed layer of Si to include the n-type impurities, or ion-implanted with n-type impurities to form an n-type buried semiconductor layer 60. The n-type buried layer 60 has a first side 62 and a second side 64. A protective layer 66 of $SiO_2$ may then be formed on the first side 62 of the n-type buried layer 60.

Throughout the steps described in FIGS. 5A–6, certain actions may require the selective coating, epitaxial growth, etching, insulating, diffusion, or ion implantation of some regions on the microcircuit, while others are left alone. This selective processing may be accomplished through the use of masking techniques which are well-known to those skilled in the art. Such masking techniques may include, for example, photolithographic films, use of photoresist, and conductive films. Although such masking techniques may be integral to the production process wherever selective deposition, diffusion, growth, insulating, etching, or sealing occurs, they are not described for each step for the sake of simplicity of explanation, and since it is within the abilities of one of ordinary skill in the art to choose to use one or more of several masking techniques based on the desired application.

As FIG. 5B illustrates, trenches 68 may be etched through the protective layer 66 and into the n-type buried layer 60. As FIG. 5C illustrates, the trenches 68 are oxidized to form a new protective $SiO_2$ layer 70. This creates a new first side 72 opposite the second side 64. A polycrystalline Si support layer 74 may be formed on the first side 72 against the protective layer 70, filling the trenches 68. The polycrystalline Si support layer 74 gives strength to the microcircuit device 59. Addition of the support layer 74 results in a new first side 76 opposite the existing second side 64. A cut-line 78 is shown in FIG. 5C. The microcircuit device 59 is then flipped over so that the first side 76 is facing downward as shown in FIG. 5D. Through a cutting, grinding, etching, or polishing process, the microcircuit 59 is cut along cut-line 78. As shown in FIG. 5D, this creates electrically isolated pockets 80 of n-type buried layer 60, which are isolated by the insulating protective $SiO_2$ layer 70. The described isolation process shown in FIGS. 5B–5D may also be used in conjunction with a well formation step, whereby areas of p-type impurities are introduced into the n-type buried layer 60 to create areas in which n-type MOS transistors or p-n-p type bi-polar transistors may be constructed. P-type MOS transistors and n-p-n type bi-polar transistors may be formed in the illustrated n-type buried layer 60, and for the sake of simplicity, this embodiment will not include well-formation. It should be understood, however, that well-formation is compatible with the embodiments of this specification and their equivalents.

The remaining actions in the construction of the microcircuit device 59 are discussed with reference to FIG. 6. FIG. 6 is an enlarged side cross-sectional view showing two isolated pockets 80A and 80B. A heterojunction bipolar transistor (HBT) is formed in pocket 80A, and a MOS transistor is formed in pocket 80B. A deep N+ collector 82 is formed through diffusion or ion implantation. The N+ collector 82 has more n-type impurities than the n-type buried layer 60.

A gate oxide 84 is formed by selectively exposing the microcircuit device 59 to appropriate temperature and atmospheric conditions to form a layer of $SiO_2$ on the pocket 80B where it is desired to have the MOS gate. Appropriate oxidation techniques are well-known to those skilled in the art. A poly-Si layer 86 is formed on-top of the gate oxide 84 by epitaxy. Next, the HBT base 88 is formed in the buried layer 60 of pocket 80A by diffusing or ion implanting p-type impurities into the buried layer 60. An insulating layer 90, here made of $SiO_2$ is formed on-top of the pockets 80A and 80B, leaving openings for contact to the semiconductor material as necessary.

The relatively high-temperature process of P+ source and drain formation occurs next, at temperatures of approximately 900° C. Source 92 and drain 94 are formed in the buried layer 60 of pocket 80B. A P+ semiconductor has more p-type impurities than a standard p-type semiconductor. Oxides 96, 97 may be formed respectively over the exposed areas of the source 92 and the drain 94.

The next action is formation of the HBT emitter 98. Emitter 98 is formed of a group III/VI material, here InSe. InSe is a layered semiconductor compound which can be grown with a large bandgap in the range of 1.4 eV to 1.9 eV or higher. As previously mentioned, the InSe emitter 98 has layers which interact with each other through Vanderwaal forces, while within the layers, atoms are bound by valence forces. This layered emitter 98 serves as a buffer to release strains caused by lattice mis-match between the base 88 and the emitter 98. InSe can be epitaxially grown at temperatures below 50020 C. on Si as a bipolar emitter 98. This makes group III/VI emitters, such as InSe emitter 98, attractive to the silicon integrated circuit industry, since the high band gap and relatively low temperature requirements allow smaller vertical dimension HBT devices to be formed on a BiMOS microcircuit device 59, after the standard MOS processes, with a minimal thermal budget impact.

The final actions involve the formation of contacts for electrical continuity with other semiconductor devices on the same microcircuit 59, or with interconnects to the outside world. A base contact 100 is formed in the gap in the protective layer 90 over the base 88. An emitter contact 102 is formed on the InSe emitter 98. A collector contact 104 is formed in the gap in the protective layer 90 over the collector 82. A source contact 106 is formed over the source oxide 96, a drain contact 108 is formed over the drain oxide 97, and a gate contact 110 is formed over the poly-Si gate interface 86.

Figure 7:
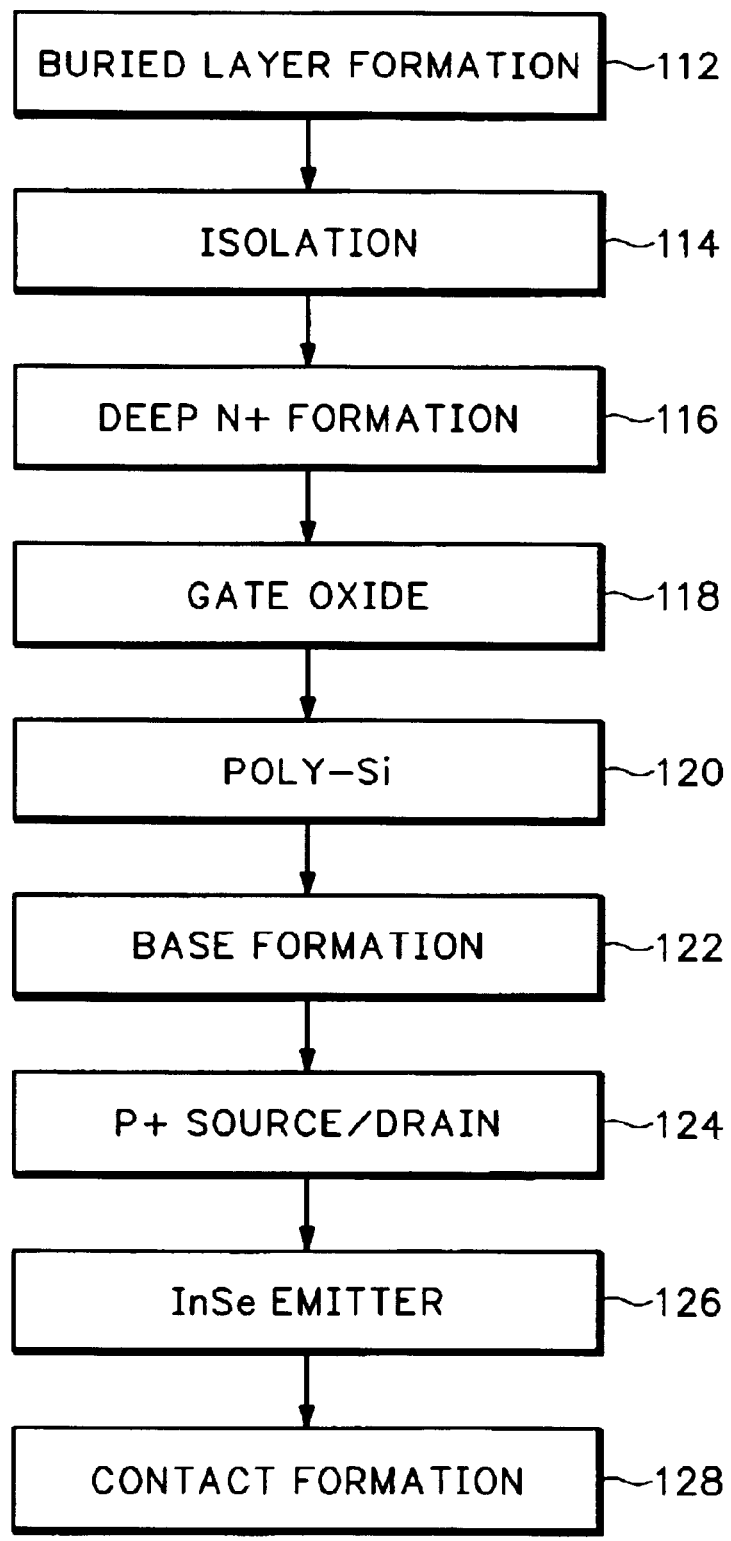
FIG. 7 illustrates an embodiment of a process flow for the construction of a BiMOS device having both a group III/VI semiconductor HBT and an MOS transistor.

FIG. 7 illustrates an embodiment of actions which may be used to construct a BiMOS device (a device having both bipolar and MOS type transistors on the same microcircuit), such as microcircuit device 59. Masking steps are omitted, and may be implemented as necessary by those skilled in the art. The construction or manufacturing begins with buried layer formation 112. Isolation 114 of the buried layer into separate regions occurs next. The HBT collectors are created by deep N+ formation 116. MOS gate oxides are formed 118, and a poly-Si layer is formed 120 on each MOS gate oxide. The HBT bases are formed 122 through the appropriate diffusion or ion implantation of impurities in the buried layer. Source and drain areas of the MOS regions are formed 124 through diffusion or ion implantation. A group III/VI semiconductor is epitaxially grown to form an emitter 126 on the HBT base. Finally, contact formation 128 is performed to link semiconductor devices together and/or to provide interconnect to the microcircuit.

Although InSe was primarily used as an example of an appropriate group III/VI semiconductor, it is apparent that other group III/VI semiconductors may be used and are deemed to be within the scope of the claims below. The embodiments discussed herein have described an n-type HBT with a group III/VI emitter. A p-type HBT is also possible by using an n-type base, a p-type collector, and doping the InSe emitter with p-type impurities. The described manufacturing embodiments are illustrative of the construction of an HBT with a group III/VI emitter or of the construction of a BiMOS device having at least one HBT with a group III/VI emitter. Other methods of isolation may be used, such as junction isolation, and other steps, such as well-formation or LDD formation (to optimize the collector performance) may be included as desired. Other semiconductor devices, such as diodes and n-type MOS transistors may be formed on a BiMOS microcircuit in addition to the n-type HBT and p-type MOS transistor as illustrated in the embodiments. The relatively low thermal budget of the group III/VI emitter provides excellent compatibility with MOS processes, and the order of construction steps may be varied where possible while still staying below the thermal budget of the group III/VI layer once it has been formed. Additionally, it is apparent that a variety of other structurally and functionally equivalent modifications and substitutions may be made to implement an embodiment of a group III/VI emitter HBT or a BiMOS device including an HBT with a group III/VI emitter according to the concepts covered herein, depending upon the particular implementation, while still falling within the scope of the claims below.

We claim:

1. A transistor, comprising:

a base;

a collector;

an emitter comprising a group III/VI semiconductor; and an emitter contact coupled to the emitter.

2. The transistor of claim 1, wherein:

the base comprises a p-type semiconductor material; and the collector comprises an n-type semiconductor material.

3. The transistor of claim 1, wherein:

the group III/VI semiconductor is doped to behave as a p-type semiconductor;

the base comprises an n-type semiconductor; and the collector comprises a p-type semiconductor.

4. The transistor of claim 1, wherein the collector comprises a buried collector.

5. The transistor of claim 1, wherein the emitter further comprises an n-type dopant.

6. A microcircuit, comprising:

at least one metal oxide semiconductor (MOS) transistor; and the transistor of claim 1.

7. A transistor, comprising:

a base;

a collector; and an emitter comprising a group III/VI semiconductor, wherein the group III/VI semiconductor is selected from the group consisting of GaS, GaSe, GaTe, InS, InSe, InTe, and TlS.

8. A transistor, comprising:

a base made of a silicon material;

a collector; and means for providing a non-silicon-based emitter with a flexible structure to relieve lattice mis-match between the emitter and the base, the emitter comprising a group III/VI semiconductor.

9. A transistor, comprising:

a base constructed of a p-type silicon material;

a base contact coupled to the base;

an emitter constructed of a group III/VI semiconductor, including InSe, comprising an n-type semiconductor;

an emitter contact coupled to the emitter;

an n-type semiconductor layer coupled to the base;

a collector contact; and a buried collector constructed from an enhanced n-type semiconductor layer, coupled to the collector contact and the n-type semiconductor layer.

* * * * *